United States Patent
Xu

(10) Patent No.: US 11,326,942 B2
(45) Date of Patent: May 10, 2022

(54) OPTICAL SENSOR ARRANGEMENT AND METHOD FOR LIGHT SENSING

(71) Applicant: ams International AG, Rapperswil (CH)

(72) Inventor: Gonggui Xu, Rapperswil (CH)

(73) Assignee: AMS INTERNATIONAL AG, Rapperswil (CH)

( * ) Notice: Subject to any disclaimer, the term of this patent is extended or adjusted under 35 U.S.C. 154(b) by 178 days.

(21) Appl. No.: 16/632,616

(22) PCT Filed: Jul. 9, 2018

(86) PCT No.: PCT/EP2018/068521
§ 371 (c)(1),
(2) Date: Jan. 21, 2020

(87) PCT Pub. No.: WO2019/020352
PCT Pub. Date: Jan. 31, 2019

(65) Prior Publication Data
US 2020/0200603 A1    Jun. 25, 2020

Related U.S. Application Data

(60) Provisional application No. 62/537,101, filed on Jul. 26, 2017.

(30) Foreign Application Priority Data

Aug. 30, 2017  (EP) .................................... 17188487

(51) Int. Cl.
*G01J 1/46*      (2006.01)
*H03M 1/12*    (2006.01)
(Continued)

(52) U.S. Cl.
CPC .................. *G01J 1/46* (2013.01); *H03M 1/12* (2013.01); *H04N 5/37455* (2013.01); *G01J 2001/446* (2013.01)

(58) Field of Classification Search
CPC ........ G01J 1/46; G01J 2001/446; H03M 1/12; H04N 5/37455
See application file for complete search history.

(56) References Cited

U.S. PATENT DOCUMENTS 7,164,379 B1    1/2007  Rao
8,378,863 B2 *  2/2013  Ishikawa ................. H03M 1/00
                                                           341/118
(Continued)

FOREIGN PATENT DOCUMENTS

CN       101604972 A    12/2009
CN       102025326 A    4/2011
(Continued)

OTHER PUBLICATIONS

European Patent Office, International Search Report for PCT/EP2018/068521 dated Aug. 9, 2018.
(Continued)

*Primary Examiner* — Seung C Sohn
(74) *Attorney, Agent, or Firm* — MH2 Technology Law Group LLP

(57) ABSTRACT

An optical sensor arrangement comprises a photodiode (11) and an analog-to-digital converter (12). The analog-to-digital converter (12) comprises an integrator (13) having an integrator input (15) coupled to the photodiode (11), a comparator (14) having a first input coupled to an output of the integrator (13) and a digital-to-analog converter (39) coupled to a control terminal of the comparator (14).

15 Claims, 15 Drawing Sheets

(51) Int. Cl.
*H04N 5/374* (2011.01)
*H04N 5/3745* (2011.01)
*G01J 1/44* (2006.01)

(56) References Cited

U.S. PATENT DOCUMENTS

| | | | |
|---|---|---|---|
| 8,658,959 B2* | 2/2014 | Gravot | H03M 1/145 |
| | | | 250/214 DC |
| 8,969,771 B2* | 3/2015 | Ikeda | H04N 5/378 |
| | | | 250/214 R |
| 9,146,162 B2 | 9/2015 | Xu | |
| 9,571,115 B1* | 2/2017 | Beukema | H03M 1/069 |
| 2009/0295610 A1 | 12/2009 | Yoshimoto | |
| 2014/0252212 A1 | 9/2014 | Xu et al. | |
| 2015/0083896 A1 | 3/2015 | Xu | |
| 2015/0102209 A1 | 4/2015 | Xu et al. | |
| 2016/0294403 A1 | 10/2016 | Kimura et al. | |

FOREIGN PATENT DOCUMENTS

| | | |
|---|---|---|
| CN | 106533443 A | 3/2017 |
| EP | 2851661 | 3/2015 |
| EP | 2863192 | 4/2015 |
| EP | 3282234 | 2/2018 |

OTHER PUBLICATIONS

Chinese First Office Action dated Jun. 8, 2021 in corresponding Chinese Application No. 201880047485.6, translated, 10 pages.

\* cited by examiner

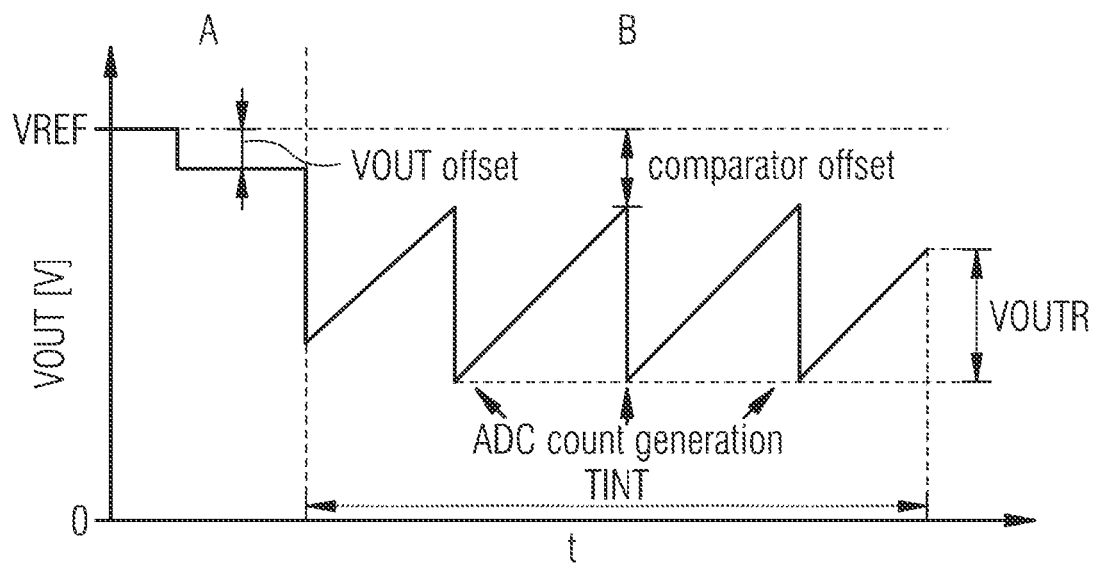

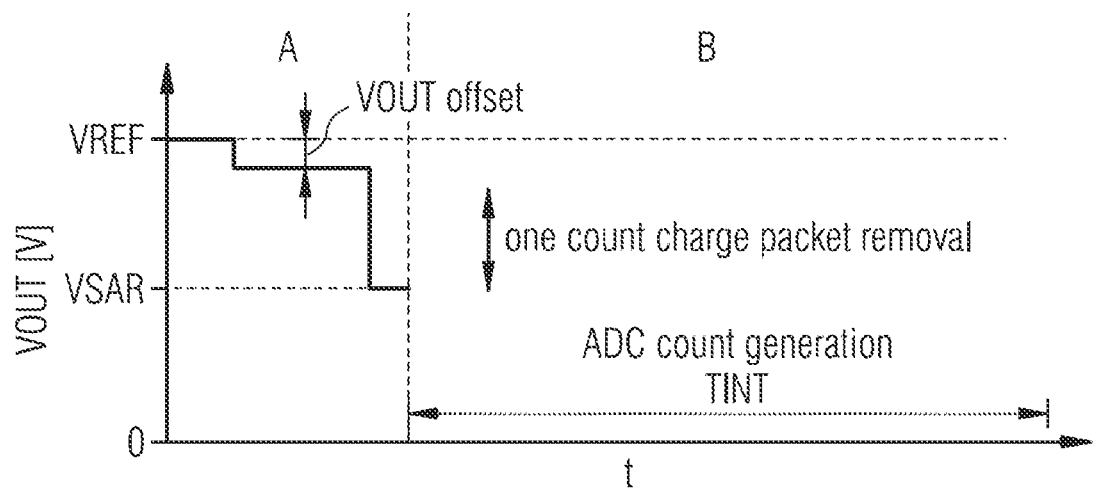

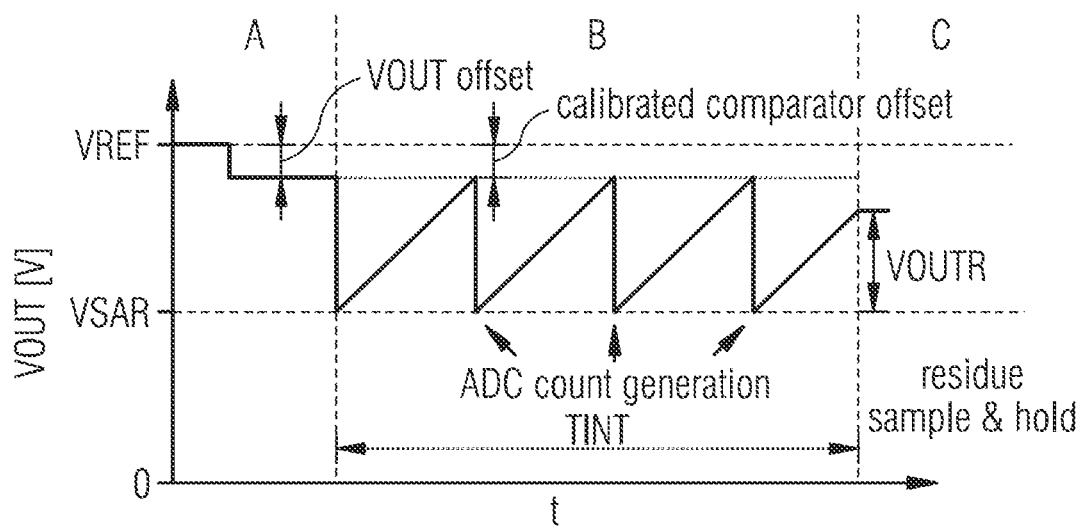

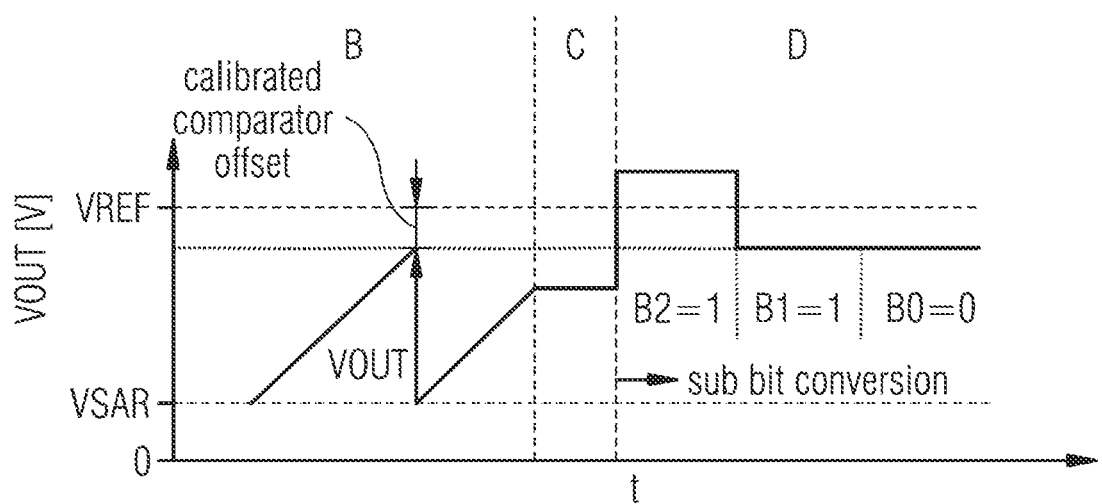

OPTICAL SENSOR ARRANGEMENT AND METHOD FOR LIGHT SENSING

CROSS-REFERENCE TO RELATED APPLICATIONS

The present application is the national stage entry of International Patent Application No. PCT/EP2018/068521, filed on Jul. 9, 2018, which claims the benefit of priority of U.S. Application 62/537,101, filed on Jul. 26, 2017 and of European Patent Application No. 17188487.7, filed on Aug. 30, 2017, all of which are hereby incorporated by reference in their entirety for all purposes.

BACKGROUND OF THE INVENTION

The present patent application is related to an optical sensor arrangement and a method for light sensing.

An optical sensor arrangement often comprises a light sensor realized as photodiode and an analog-to-digital converter, abbreviated as AD converter. The optical sensor arrangement can be used for ambient light sensing. The optical sensor arrangement may be buried underneath a dark glass, for example in a device for mobile communication. Thus, a high accuracy in the case of weak incident light is advantageous. Especially, the state of the optical sensor arrangement at a start of a measuring phase has an influence on the accuracy.

SUMMARY OF THE INVENTION

An optical sensor arrangement and a method for light sensing are provided, e.g. with improved accuracy.

The definitions as described above also apply to the following description unless stated otherwise.

In an embodiment, an optical sensor arrangement comprises a photodiode and an analog-to-digital converter, abbreviated AD converter. The AD converter comprises an integrator having an input coupled to the photodiode, a comparator having a first input coupled to an output of the integrator and a digital-to-analog converter coupled to a control terminal of the comparator.

Advantageously, the digital-to-analog converter, abbreviated as DA converter, provides an analog input signal to the control terminal of the comparator. Thus, an offset of the comparator can be controlled by the analog input signal provided from the DA converter. The analog input signal can be determined in a calibration phase such that a switching point of the comparator has an appropriate value. The value of the analog input signal determined in the calibration phase is maintained and kept constant during a measuring phase that follows the calibration phase. Thus, the accuracy of light sensing is improved.

In an embodiment, the optical sensor arrangement comprises an input switch that couples the photodiode to the integrator input. In the case that the input switch is set in a non-conducting state, the photodiode does not provide any current to the integrator input. In the case that the input switch is set in a conducting state, a sensor current generated by the photodiode is provided to the integrator input.

In an embodiment, the optical sensor arrangement comprises a further input switch that couples the integrator input to a reference potential terminal. Advantageously, the further input switch provides a reference potential to the integrator input, when the further input switch is set in a conducting state. The reference potential is tapped at the reference potential terminal.

In an embodiment, the AD converter comprises a reference capacitor circuit that is coupled to the integrator input. The reference capacitor circuit is configured to provide a charge packet or more than one charge packet to the integrator input.

In a further development, the reference capacitor circuit comprises a reference capacitor and at least two switches. The reference capacitor circuit is configured to charge the reference capacitor and to provide the charge stored on the reference capacitor to the integrator input. The charge provided by the reference capacitor circuit has the opposite sign to that of the charge provided by the photodiode to the integrator input. Thus, a charge stored by the integrator as a function of the sensor current can be reduced by a charge packet provided by the reference capacitor circuit.

In an embodiment, the optical sensor arrangement comprises a control logic coupled to a comparator output of the comparator. Advantageously, a comparator output signal is provided by the comparator and is applied to the control logic. The control logic may comprise a counter for counting the pulses of the comparator output signal. The control logic provides a result signal. The result signal is a digital value of the sensor current. The result signal represents the light detected by the photodiode. The digital value may be a function of the number of pulses counted by the counter. The control logic may be connected to a control terminal of the input switch, a control terminal of the further input switch and control terminals of the several switches of the reference capacitor circuit.

Moreover, the control logic may be connected to an input of the DA converter. Additionally, the control logic may comprise a memory for storing a digital input signal that is provided to the DA converter.

In an embodiment, the integrator comprises an amplifier having a first amplifier input connected to the integrator input and an amplifier output coupled to the output of the integrator.

In an embodiment, the integrator comprises a first integrating capacitor with a first electrode coupled to the first amplifier input and with a second electrode coupled to the amplifier output. The first electrode of the first integrating capacitor may be directly and permanently connected to the amplifier input. The second electrode of the first integrating capacitor may be directly and permanently connected to the amplifier output.

In an embodiment, the integrator comprises a first switch coupling the second electrode of the first integrating capacitor to the amplifier output.

In an embodiment, the integrator comprises a first reference switch coupling the second electrode of the first integrating capacitor to a reference voltage terminal.

In an embodiment, the analog-to-digital converter comprises a calibration digital-to-analog converter coupled to a control terminal of the amplifier. Advantageously, the calibration digital-to-analog converter, abbreviated as the calibration DA converter, provides an analog signal to the control terminal of the amplifier. Thus, an offset of the amplifier is set by the calibration DA converter.

In an embodiment, the integrator comprises a second integrating capacitor with a first electrode coupled to the first amplifier input and with a second electrode coupled to the amplifier output.

In an embodiment, the integrator comprises a second switch coupling the second electrode of the second integrating capacitor to the amplifier output.

In an embodiment, the integrator comprises a second reference switch coupling the second electrode of the second integrating capacitor to the reference voltage terminal.

Advantageously, the characteristic of the integrator can be set by the use of the first and the second integrating capacitor. The integrator provides an output voltage at the output of the integrator. The output voltage has a high sensitivity with reference to the sensor current in the case that only one of the first and the integrating capacitor is set as active. Contrary to that the output voltage has a low sensitivity to the sensor current in the case that both integrating capacitors are set as active. Both integrating capacitors are set as active by setting the first and the second switch in a conducting state. The control logic controls the first and the second switch.

In an embodiment, the integrator comprises a further first switch coupling the second electrode of the first integrating capacitor to a further reference voltage terminal. The integrator may comprise a further second switch coupling the second electrode of the second integrating capacitor to an additional reference voltage terminal. A reference voltage is tapped at the reference voltage terminal. A further reference voltage is tapped at the further reference voltage terminal. An additional reference voltage is tapped at the additional reference voltage terminal. Advantageously, the further reference voltage and the additional reference voltage may both be different from the reference voltage. The additional reference voltage may be different from the further reference voltage. Alternatively, the additional reference voltage and the further reference voltage may be equal.

In an embodiment, the further first switch and the further second switch are set in a non-conducting state during a calibration phase and a measuring phase. The further first and the further second switch are selectively set in a conducting state or a non-conducting state during a residual digitization phase. By setting the further first and/or the further second switch in a conducting state or a non-conducting state, the output voltage can be changed in the residual digitization phase. The two switches can be set in a conducting state or a non-conducting state such that the comparator changes its comparator output signal. The comparator toggles by an appropriate setting of the further first switch and the further second switch in a conducting state or a non-conducting state during the residual digitization phase.

The integrator may comprise further integrating capacitors and corresponding further switches coupling the second electrodes of the further capacitors to the amplifier output. Additionally, the integrator may comprise further reference switches coupling the second electrodes of the further integrating capacitors to the reference voltage terminal. Moreover, the integrator may comprise further switches coupling the second electrodes of the further integrating capacitors to further reference voltage terminals.

The integrator may comprise a first number N of integrating capacitors. The first number N may be, for example, 8. The capacitance values of the first number N of capacitors may be equal. Alternatively, the capacitance values of the first number N of capacitors are binary coded.

In an embodiment, a second input of the comparator is coupled to the reference voltage terminal.

The optical sensor arrangement implements an ambient light sensor. The optical sensor arrangement is realized as a light sensor with improved first count accuracy.

In an embodiment, the optical sensor arrangement is configured for an application in consumer electronics. An optional application is the display management where the ambient light sensor (ALS) can be used to measure the ambient light brightness. The optical sensor arrangement is realized as an ambient light sensor. If the ambient light is bright, a higher backlight illumination for a display panel is used. If the ambient light is dark, a lower backlight illumination for the display panel is set. By dynamically adjusting the display panel brightness, the ambient light sensor helps to optimize the operation power of the display panel.

In an embodiment, the ambient light sensor is buried underneath a dark glass, for example, in a mobile phone application, for a stylish fashion. In order to get more signal from weak incident light, higher digitization resolution of the ALS is advantageous. The ambient light sensor described in this disclosure achieves an improved accuracy in first count generation.

In an embodiment, the fundamental parasitic charge injections associated with switches are not eliminated in the optical sensor arrangement, rather these parasitic charge injections are just contained and equal in every count generation of the AD converter. Thus, a circuit architecture and comparator input offset calibration scheme is realized and a higher digitization resolution is hence achieved.

The optical sensor arrangement may use two offset calibrations. The optical sensor arrangement may use a sub-count digitization scheme.

In an embodiment, a method for light sensing comprises providing an analog input signal by a digital-to-analog converter to a control terminal of a comparator, generating a sensor current by a photodiode and providing the sensor current to an input of an integrator, generating an output voltage by the integrator and providing the output voltage to a first input of the comparator, and determining a digital value of the sensor current as a function of an comparator output signal generated by the comparator.

The method for light sensing may be implemented for example by the optical sensor arrangement according to one of the embodiments defined above.

Advantageously, a switching point of the comparator depends on the analog input signal. Thus, the accuracy of light sensing is improved by adjusting an appropriate value of the analog input signal.

In an embodiment, the digital value of the sensor current depends on the comparator output signal.

In an embodiment, the comparator output signal that is provided by the comparator is applied to a control logic. The control logic provides a result signal. The result signal is the digital value of the sensor current. The result signal represents the light detected by the photodiode.

The comparator output signal may be a pulsed signal or a pulse-shaped signal.

In an embodiment, the control logic comprises a counter that counts the pulses of the comparator output signal. The result signal or the digital value of the sensor current may be a function of the number of pulses counted by the counter. The result signal or the digital value of the sensor current may depend on the number of pulses counted by the counter. The result signal or the digital value of the sensor current may be equal to the number of pulses counted by the counter. Alternatively, the result signal or the digital value of the sensor current may be a function of the pulses of the comparator output signal during the measuring phase and of bits determined by digitization of a residual output value.

In an embodiment, a value of the analog input signal is determined in a calibration phase and is kept constant during a measuring phase following the calibration phase.

In an embodiment, an input switch couples the photodiode to the integrator input. In the measuring phase, the input switch is set in a conducting state. In the measuring phase, the photodiode is connected to the integrator input. During the calibration phase, the input switch may be set in a non-conducting state. Thus, in the calibration phase, the photodiode may be not connected to the integrator input. Alternatively, e.g. in case of low light, the input switch may optionally be in a conducting state in the calibration phase or in a part of the calibration phase.

In an embodiment, optionally, a sample and hold phase and/or a residual digitization phase may follow the measuring phase. During this or these phases, the input switch may be set in a non-conducting state and, thus, the photodiode may be not connected to the integrator input.

In an embodiment, a second input of the comparator is coupled to a reference voltage terminal. A reference voltage is tapped at the reference voltage terminal and applied to the second input of the comparator.

In an embodiment, an offset of the comparator is controlled by the analog input signal. The offset of the comparator may be set by the analog input signal.

In an embodiment, the comparator output signal depends on the output voltage, the reference voltage and the analog input signal.

In an embodiment, in the calibration phase (e.g. in a second part of the calibration phase), a digital input signal that is provided to the digital-to-analog converter is varied. Since the digital-to-analog converter generates the analog input signal, the analog input signal is varied as a function of the digital input signal. The digital input signal and consequently the analog input signal are varied until the comparator output signal changes its value. Thus, in the calibration phase (e.g. in the second part of the calibration phase), a value of the digital input signal and consequently a value of the analog input signal are determined at which the comparator toggles. This value of the digital input signal is stored and used in the measuring phase. The comparator may toggle when the comparator output signal changes its value once or more than once.

BRIEF DESCRIPTION OF THE DRAWINGS

The following description of figures of embodiments may further illustrate and explain aspects of the optical sensor arrangement and the method for light sensing. Devices and circuit parts with the same structure and the same effect, respectively, appear with equivalent reference symbols. In so far as devices or circuit parts correspond to one another in terms of their function in different figures, the description thereof is not repeated for each of the following figures.

FIGS. 1A and 1B show embodiments of an optical sensor arrangement and of signals of the optical sensor arrangement;

FIGS. 2A to 2M show embodiments of an optical sensor arrangement in different phases and of corresponding signals of the optical sensor arrangement.

DETAILED DESCRIPTION

Figure 1A:
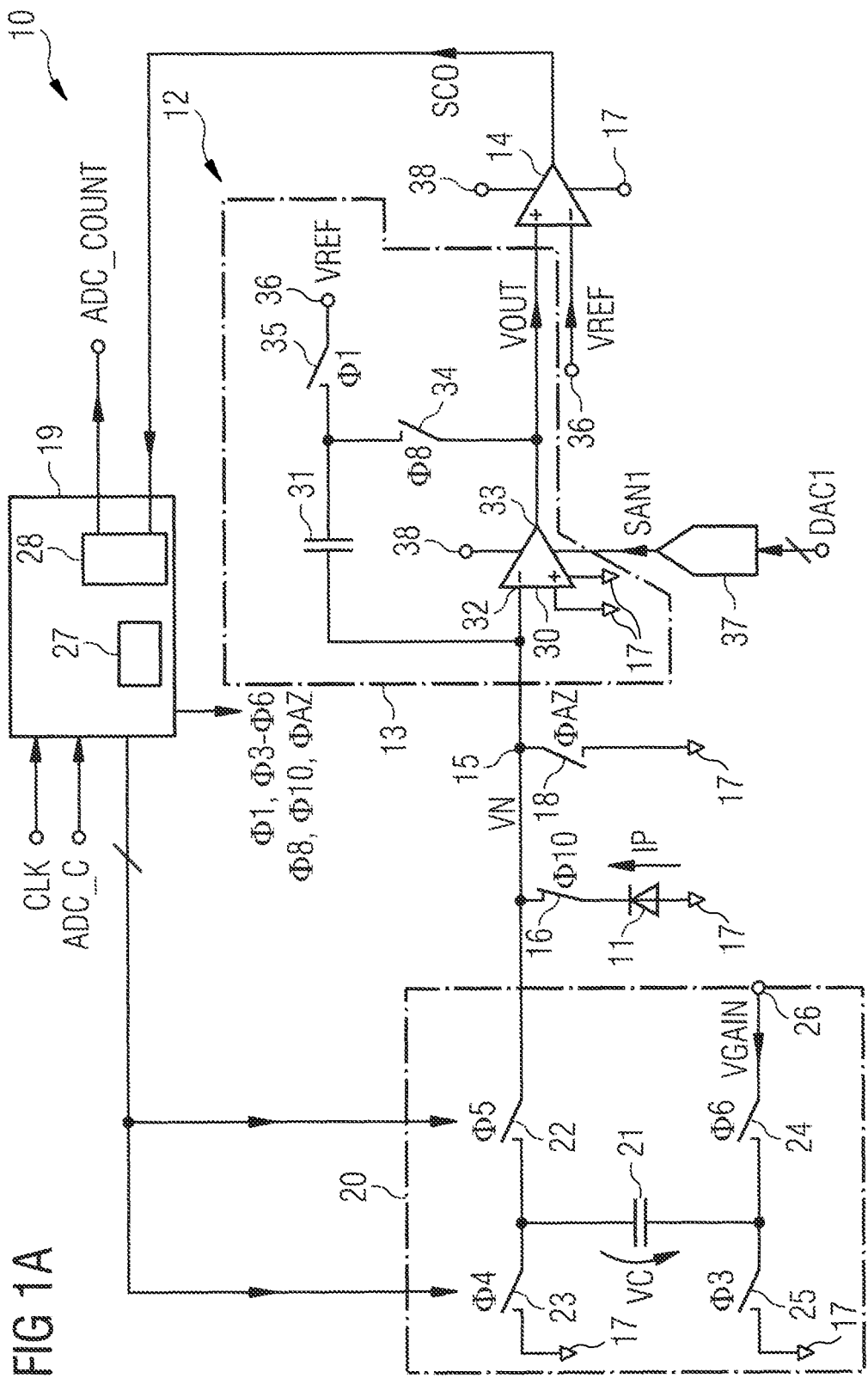

FIG. 1A shows an embodiment of an optical sensor arrangement 10 that comprises a photodiode 11 and an analog-to-digital converter 12, abbreviated as AD converter. The AD converter 12 comprises an integrator 13 and a comparator 14. The integrator 13 comprises an integrator input 15 that is coupled to the photodiode 11. The photodiode 11 is connected to a reference potential terminal 17. Additionally, the optical sensor arrangement 10 comprises an input switch 16 that couples the photodiode 11 to the integrator input 15. An anode of the photodiode 11 is connected to the reference potential terminal 17 and a cathode of the photodiode 11 is coupled via the input switch 16 to the integrator input 15.

Moreover, the optical sensor arrangement 10 comprises a further input switch 18 that couples the converter input 15 to the reference potential terminal 17. Additionally, the optical sensor arrangement 10 comprises a control logic 19 having an input connected to a comparator output of the comparator 14. The control logic 19 comprises outputs that are connected to a control terminal of the input switch 16 and a control terminal of the further input switch 18 by not shown connection lines.

Additionally, the AD converter 12 comprises a reference capacitor circuit 20 that is coupled to the integrator input 15. The reference capacitor circuit 20 comprises a reference capacitor 21 and at least two reference capacitor switches. A first reference capacitor switch 22 couples a first electrode of the reference capacitor 21 to the integrator input 15. A second reference capacitor switch 23 couples the first electrode of the reference capacitor 21 to the reference potential terminal 17. A third reference capacitor switch 24 couples a second electrode of the reference capacitor 21 to a gain voltage terminal 26. A fourth reference capacitor switch 25 couples the second electrode of the reference capacitor 21 to the reference potential terminal 17. The control logic 19 comprises outputs that are connected to control terminals of the first to the fourth reference capacitor switch 22 to 25.

The integrator 13 comprises an amplifier 30 and a first integrating capacitor 31. The first integrating capacitor 31 is arranged between a first amplifier input 32 of the amplifier 30 and an amplifier output 33 of the amplifier 30. The first electrode of the first integrating capacitor 31 is directly and permanently connected to the first amplifier input 32. The second electrode of the first integrating capacitor 31 is coupled to the amplifier output 33. The integrator 13 comprises a first switch 34 that couples the second electrode of the first integrating capacitor 31 to the amplifier output 33. A first reference switch 35 of the integrator 13 couples the second electrode of the first integrating capacitor 31 to a reference voltage terminal 36. Additionally, the AD converter 12 comprises a calibration digital-to-analog converter 37, abbreviated calibration DA converter. The calibration DA converter 37 is connected on its output side to a control terminal of the amplifier 30. On the input side, the calibration DA converter 37 is coupled to an output of the control logic 19 by a not shown bus line. The control logic 19 comprises a memory 27. Furthermore, the control logic 19 comprises a counter 28 coupled on its input side to the output of the comparator 14. The amplifier 30 and the comparator 14 are both connected to a supply voltage terminal 38 and to the reference potential terminal 17.

The amplifier output 33 is connected to a first input of the comparator 14. The reference voltage terminal 36 is connected to a second input of the comparator 14. The first input of the comparator 14 is realized as a non-inverting input and the second input of the comparator 14 is realized as an inverting input.

The first amplifier input 32 is realized as an inverting input. The amplifier 30 additionally comprises a second amplifier input. The second amplifier input is realized as a non-inverting input. The second amplifier input is connected to the reference potential terminal 17.

The photodiode 11 generates a sensor current IP. The integrator 13 generates an output voltage VOUT at the amplifier output 33. The output voltage VOUT can also be named integrator output voltage or amplifier output voltage. The output voltage VOUT is provided to the first input of the comparator 14. At the reference voltage terminal 36, a reference voltage VREF is tapped. A not-shown reference voltage source may be connected or coupled to the reference voltage terminal 36. The reference voltage source may optionally be realized as bandgap circuit. The reference voltage VREF is provided to the second input of the comparator 14. The reference voltage VREF can be applied to the second electrode of the first integrating capacitor 31, when the first reference switch 35 is set in a conducting state. The reference voltage VREF can be provided to the amplifier output 33 and the first input of the comparator 14, when the first reference switch 35 and the first switch 34 are set in a conducting state The comparator 14 generates a comparator output signal SCO at the comparator output. The comparator output signal SCO is provided to the control logic 19. The counter 28 counts the pulses of the comparator output signal SCO during a measurement time TINT. The measurement time TINT can also be named integration time. The integrator 13 performs an integration during the measurement time TINT. The control logic 19 generates a result signal ADC_COUNT. The result signal ADC_COUNT is a function of the value stored in the counter 28 at the end of the measurement time TINT. The result signal ADC_COUNT can be named counter signal. The control logic receives a clock signal CLK. Additionally, the control logic 19 receives a control signal ADC_C. The control logic 19 generates a digital signal DAC1 and provides it to the calibration DA converter 37. The digital signal DAC1 is stored in the memory 27. The calibration DA converter 37 generates an analog signal SAN1 and applies it to the control terminal of the amplifier 30.

The control logic 19 generates control signals φ1, φ8, φ10, φAZ, φ3 to φ6 that are provided to the control terminals of the first reference switch 35, the first switch 34, the input switch 16, the further input switch 18 and the first to the fourth reference capacitor switches 22 to 25. The control signals can also be named clock phases or clock signals. The reference capacitor circuit 20 provides a charge packet CP to the integrator input 15. The charge packet CP can also be named charge package. The charge packet CP has a value according to the following equation:

$$CP = CREF \cdot VGAIN,$$

wherein CREF is a capacitance value of the reference capacitor 21 and VGAIN is a voltage value of a terminal voltage tapped at the gain voltage terminal 26. An input voltage VN is tapped at the integrator input 15. The control signal ADC_C has a first logical value in a calibration phase A and a second logical value in a measuring phase B. The first logical value may be low or 0 V and the second logical value may be high or the value of a supply voltage AVDD. The supply voltage AVDD is tapped at the supply voltage terminal 38.

FIG. 1B shows an embodiment of signals of the optical sensor arrangement 10 shown in FIG. 1A. The measuring phase marked with B follows the calibration phase marked with A. During the calibration phase A, the input switch 16 is set in a non-conducting state. Thus, the photodiode 11 is not connected to the integrator input 15 in the calibration phase A. The further input switch 18 is set in a conducting state such that the integrator input 15 is connected to the reference potential terminal 17. The first integrating capacitor 31 is first charged to the reference voltage VREF, when the further input switch 18 and the first reference switch 35 are closed (they are set in a conducting state).

After that, the first switch 34 is set in a conducting state and the first reference switch 35 is set in a non-conducting state. Thus, the reference voltage VREF is provided to the second electrode of the first integrating capacitor 31 and to the amplifier output 33. Thus, at the start of the calibration phase A, the output voltage VOUT has the value of the reference voltage VREF.

During the calibration phase A, the further input switch 18 and the first reference switch 35 are set in a non-conducting state again. Thus, the value of the output voltage VOUT may drop by a value VOUT offset.

In the measuring phase B in the example shown in FIG. 1B, the output voltage VOUT is higher than a switching point of the comparator 14. Thus, the reference capacitor circuit 20 provides a charge packet CP to the integrator input 15. The output voltage VOUT drops by a predetermined value that corresponds to the value of the charge packet CP.

The sensor current IP is provided from the photodiode 16 to the integrator input 15. Thus, the output voltage VOUT raises again. When the output voltage VOUT reaches the switching point of the comparator 14, a second charge packet CP is provided from the reference capacitor circuit 20 to the integrator input 15.

The measurement time TINT of the measuring phase B is predetermined. As can be seen in FIG. 1B, the comparator switching point is lower than the reference voltage VREF. There is a difference with the value comparator offset between the reference voltage VREF and the switching point of the comparator 14. At the end of the measuring phase B, the output voltage VOUT has a residual output value VOUTR.

As illustrated in FIGS. 1A and 1B, the optical sensor arrangement 10 realizes an ambient light sensor, abbreviated ALS. The AD converter 12 is realized as a charge balancing analog-to-digital converter. The AD converter 12 collects the sensor current IP that can be called photon current from the photodiode 11 and converts into an ALS count. The sensor current IP is integrated into the first integrating capacitor 31 and the output voltage VOUT is ramping up. If the output voltage VOUT is larger than the reference voltage VREF (or more exactly large than the switching point of the comparator 14 which is a function of the reference voltage VREF), the control logic 19 will increment the result signal ADC_COUNT of the counter 28 and the charge on the integrating capacitor 31 will be decreased by one unit charge packet CP=CREF·VGAIN. By integrating the sensor current IP in the measurement time TINT that is a certain amount of time (100 ms for example), the result signal ADC_COUNT will give the brightness of ambient light. The amplifier 30 is realized as an operational amplifier. The detailed electrical operation will be explained in the following.

Initially, when the control signal ADC_C is low: the photodiode 11 is cleared; the first integrating capacitor 31 is cleared; the output voltage VOUT of the amplifier 30 is reset at a voltage lower than the reference voltage VREF; the comparator output signal SCO is low; the charge packet CP is fully cleared and disconnected from the integrator input 15; the result signal ADC_COUNT is cleared to be 0.

When the control signal ADC_C is high: the sensor current IP is integrated into the first integrating capacitor 31 and the output voltage VOUT is ramping up. When the output voltage VOUT is larger than the reference voltage VREF (or more exactly larger than the switching point of the comparator 14), the comparator output signal SCO is high and a charge packet CP=CREF·VGAIN, controlled by the control signals φ3 to φ6, is removed from the input voltage VN at the integrator input 15 and the result signal ADC_COUNT will be incremented by one count. The result signal ADC_COUNT may be an output signal of the counter 28. After the charge removing, the output voltage VOUT is lower than the reference voltage VREF and the reference capacitor circuit 20 is disconnected from the integrator input 15 and is back to recharging mode. The reference capacitor circuit 20 can be named charge packet circuit. Over a certain period namely the measurement time TINT, the number of charge removing, which is equal to the value of the result signal ADC_COUNT and is also known as the ambient light count, will be generated according to the following charge conservation equation:

$$ADC\_COUNT=(TINT \cdot IP)/(CREF \cdot VGAIN)$$

The above process is described in FIG. 1B, where the result signal ADC_COUNT=3. To get higher digitization resolution, one can further digitize the left-over residual output value VOUTR of the amplifier's output. This residue or residual may be not accurate for two reasons: 1. the initialization of the amplifier's output and the first ALS count might not be accurate; 2. the comparator input might have finite offset.

The charge packet CP=CREF·VGAIN may be very small (around 3 femto-coulomb for example); the first ALS count accuracy is limited by the parasitic charge injections of associated switches 16, 18, 22 to 25 which are controlled by the control signals φAZ, φ3 to φ6, φ10 and so on.

Figure 2A:
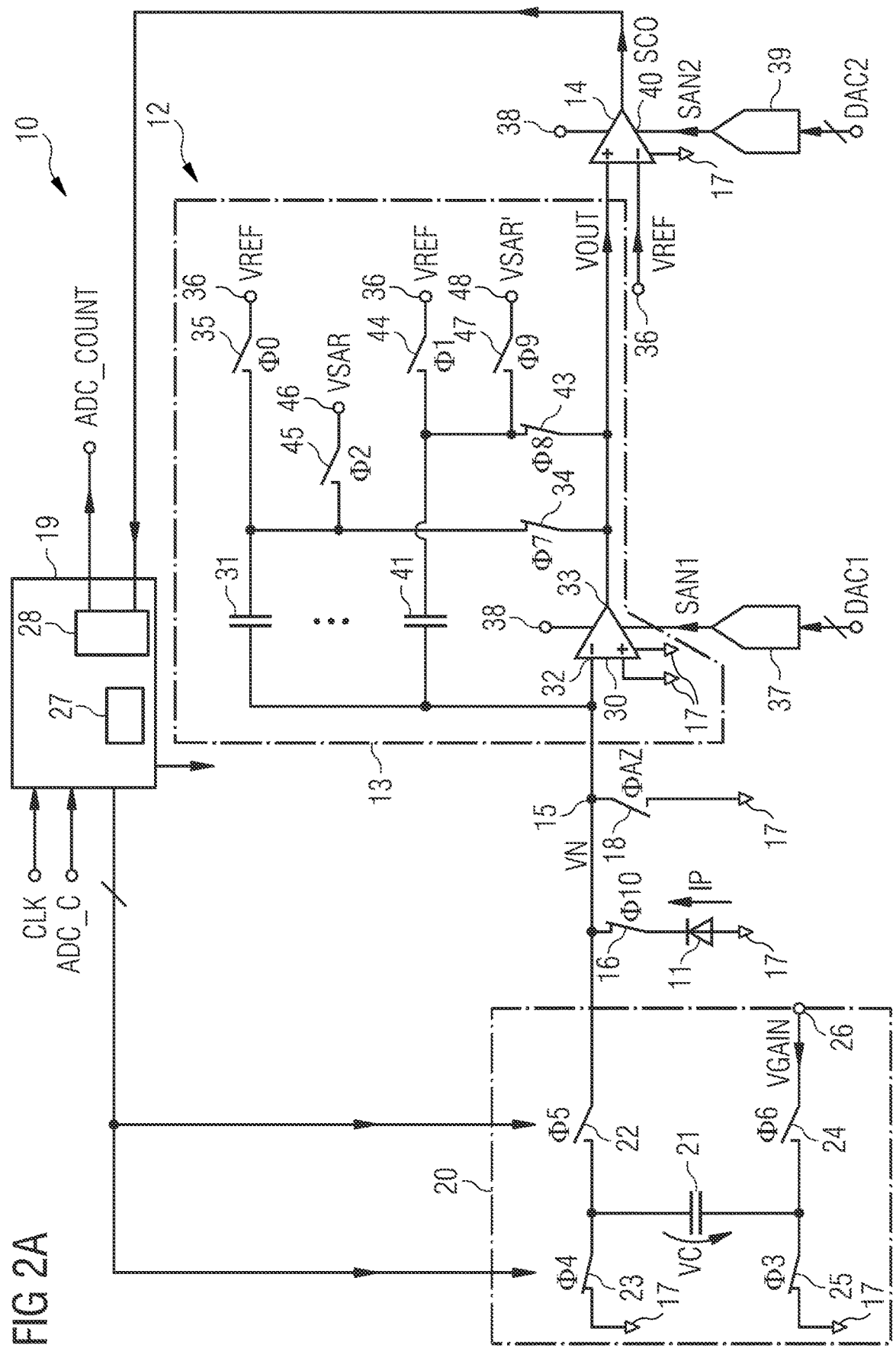

FIG. 2A shows an embodiment of the optical sensor arrangement 10 that is a further development of the embodiment explained by FIGS. 1A and 1B. Additionally, the AD converter 12 comprises a DA converter 39 that is coupled on its output side to a control terminal 40 of the comparator 14. The DA converter 39 is connected on its input side to an output of the control logic 19.

Additionally, the integrator 13 comprises a second integrating capacitor 41 that is arranged between the first amplifier input 32 and the amplifier output 33. The integrator 13 comprises a second switch 43. A first electrode of the second integrating capacitor 41 is connected to the amplifier input 32. A second electrode of the second integrating cap 41 is connected via the second switch 43 to the amplifier output 33. Additionally, the integrator 13 comprises a second reference switch 44 coupling the reference voltage terminal 36 to the second electrode of the second integrating capacitor 41.

Furthermore, the integrator 13 comprises a further first switch 45 that couples the second electrode of the first integrating capacitor 31 to a further reference voltage terminal 46. The integrator 13 comprises a further second switch 47 that couples the second electrode of the second integrating capacitor 41 to an additional reference voltage terminal 48. The additional reference voltage terminal 48 may be directly connected to the further reference voltage terminal 46.

As indicated by dots in FIG. 2A, the integrator 13 may comprise at least a further integrating capacitor and three further switches, realized such as the first integrating capacitor 31 and the switches 34, 35, 45.

The control logic 19 provides a digital input signal DAC2 to the DA converter 39. The DA converter 39 generates an analog input signal SAN2 and provides it to the control input 40 of the comparator 14.

In FIG. 2A, the optical sensor arrangement 10 realizes a light sensor architecture. Besides the amplifier's input offset correction using the calibration DA converter 37, there are further features: A comparator input offset calibration using the DA converter 39. The integrating capacitor of the integrator 13 is sub-divided for sub-count digitization. The first switch 16 controlled by the control signal φ10 assists the comparator input offset calibration and sub-count digitization. The amplifier's output offset is the same as the comparator's input offset. When the comparator's input offset is calibrated, initial amplifier output offset will be accurate, therefore the first count accuracy is maintained.

Figure 2B:
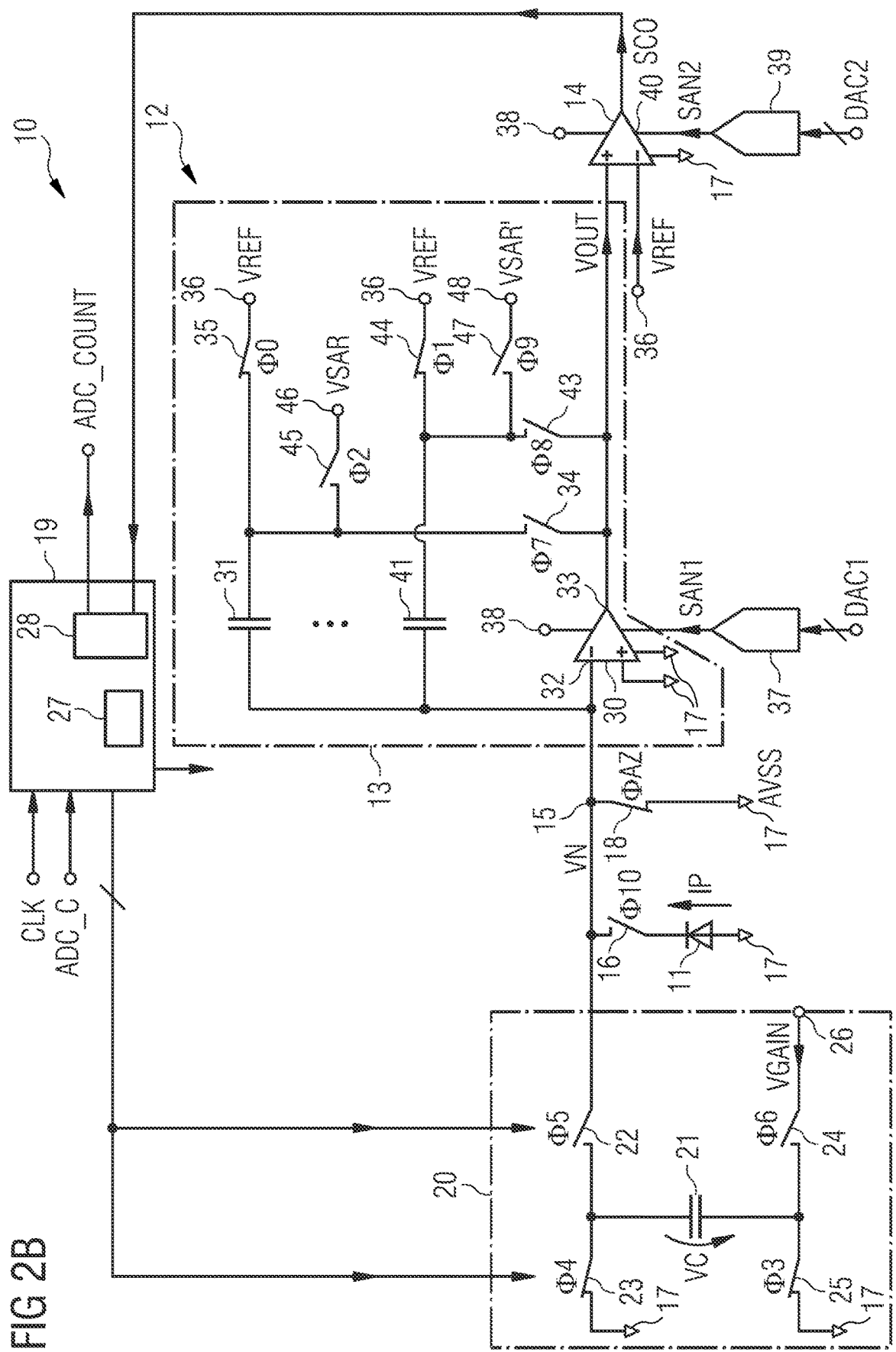
Figure 2C:
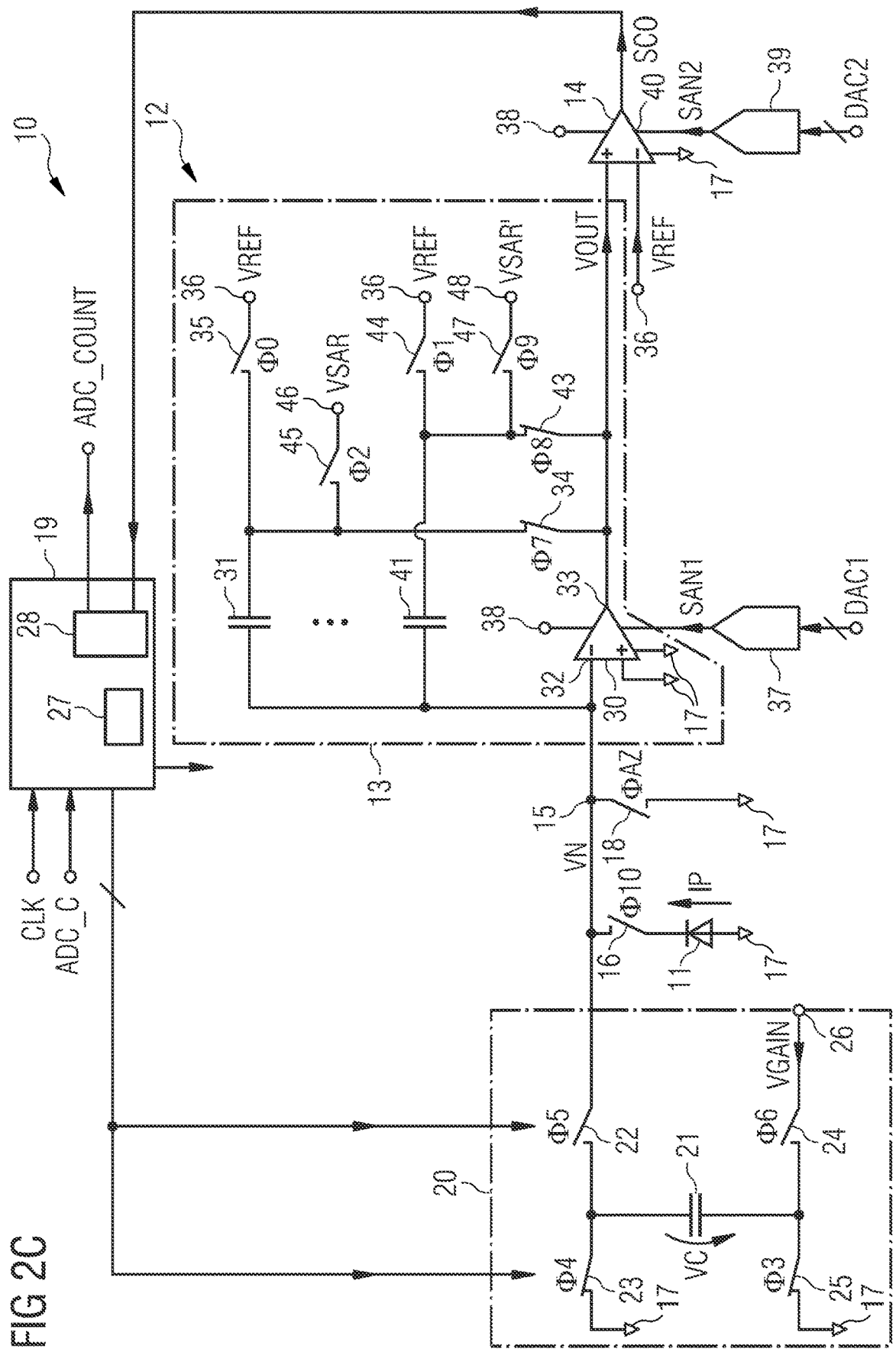
Figure 2D:
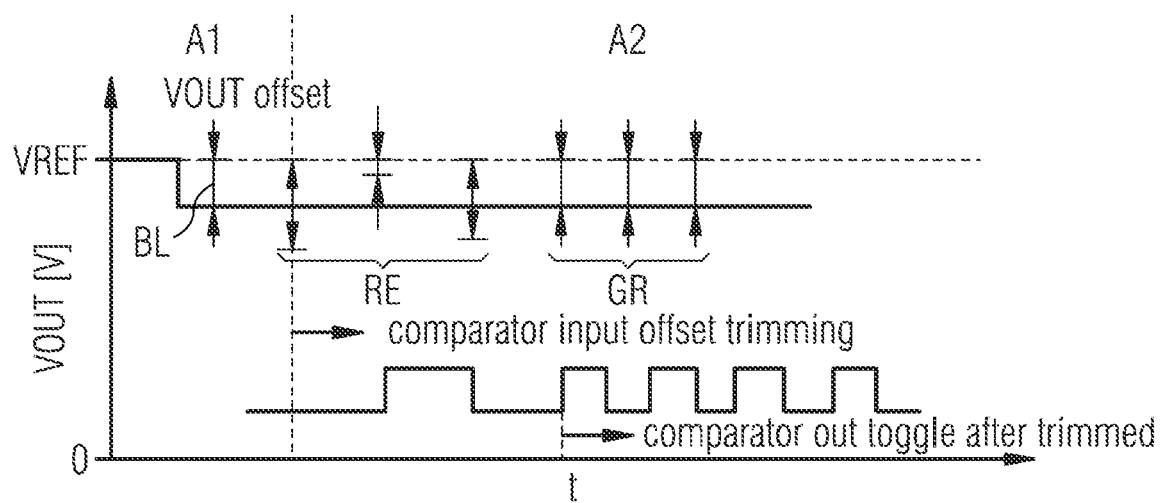
Figure 2E:
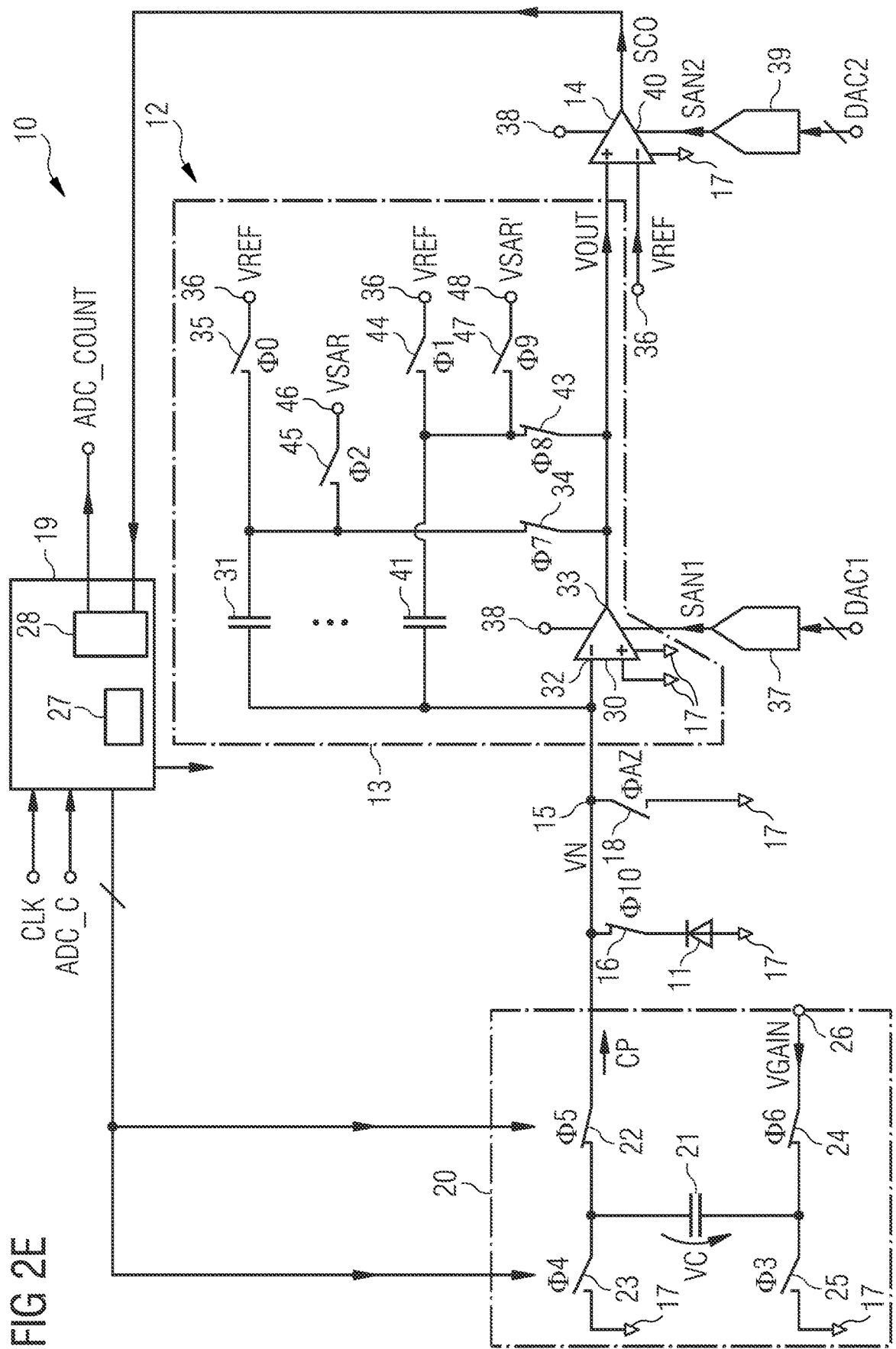
Figure 2G:
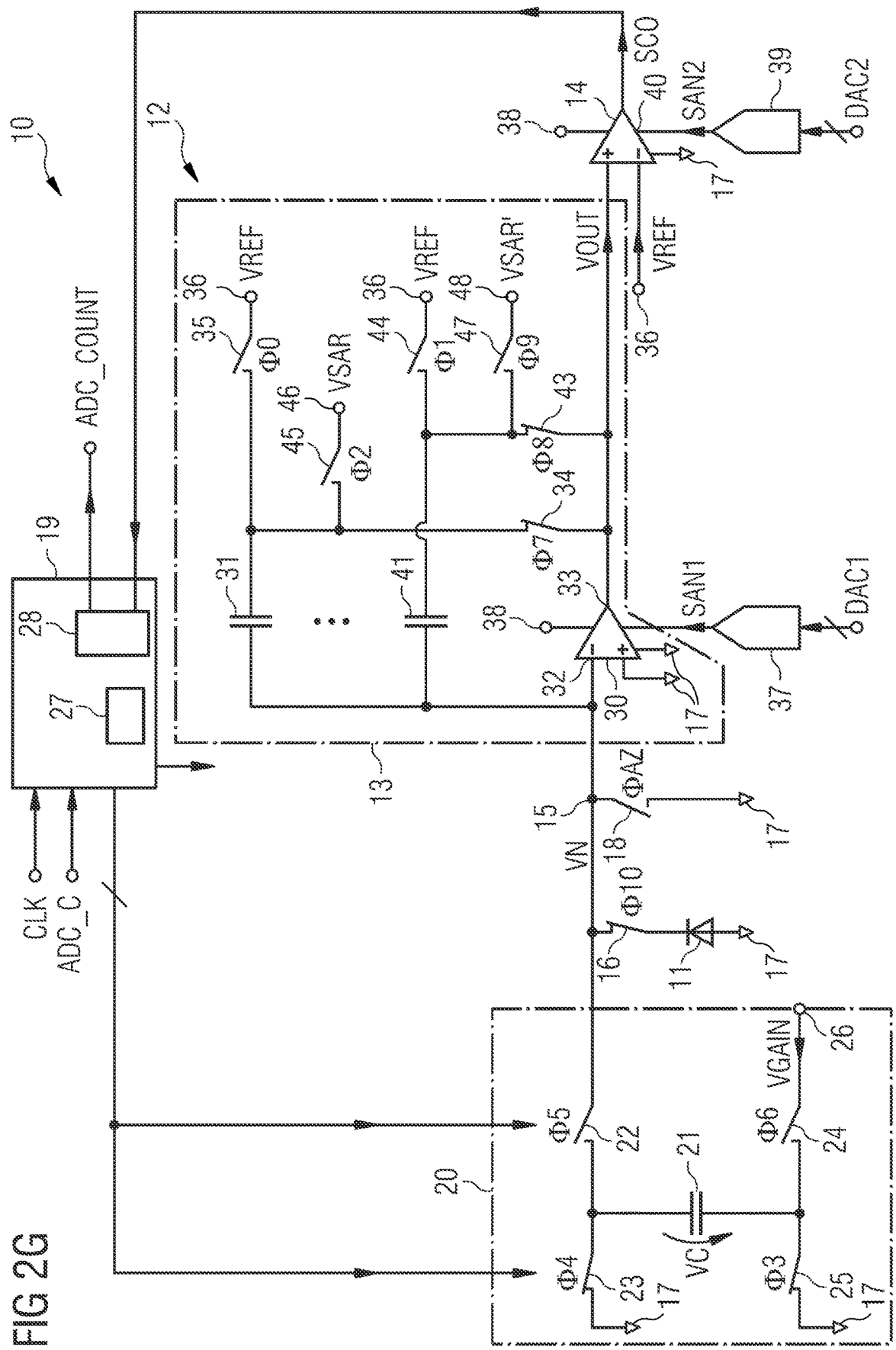
Figure 2H:
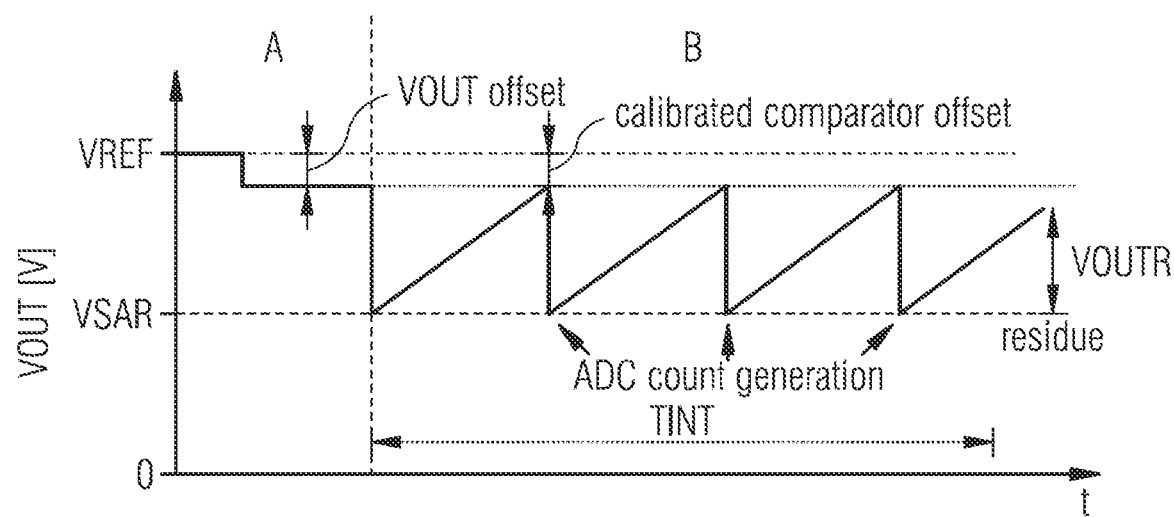
Figure 2I:
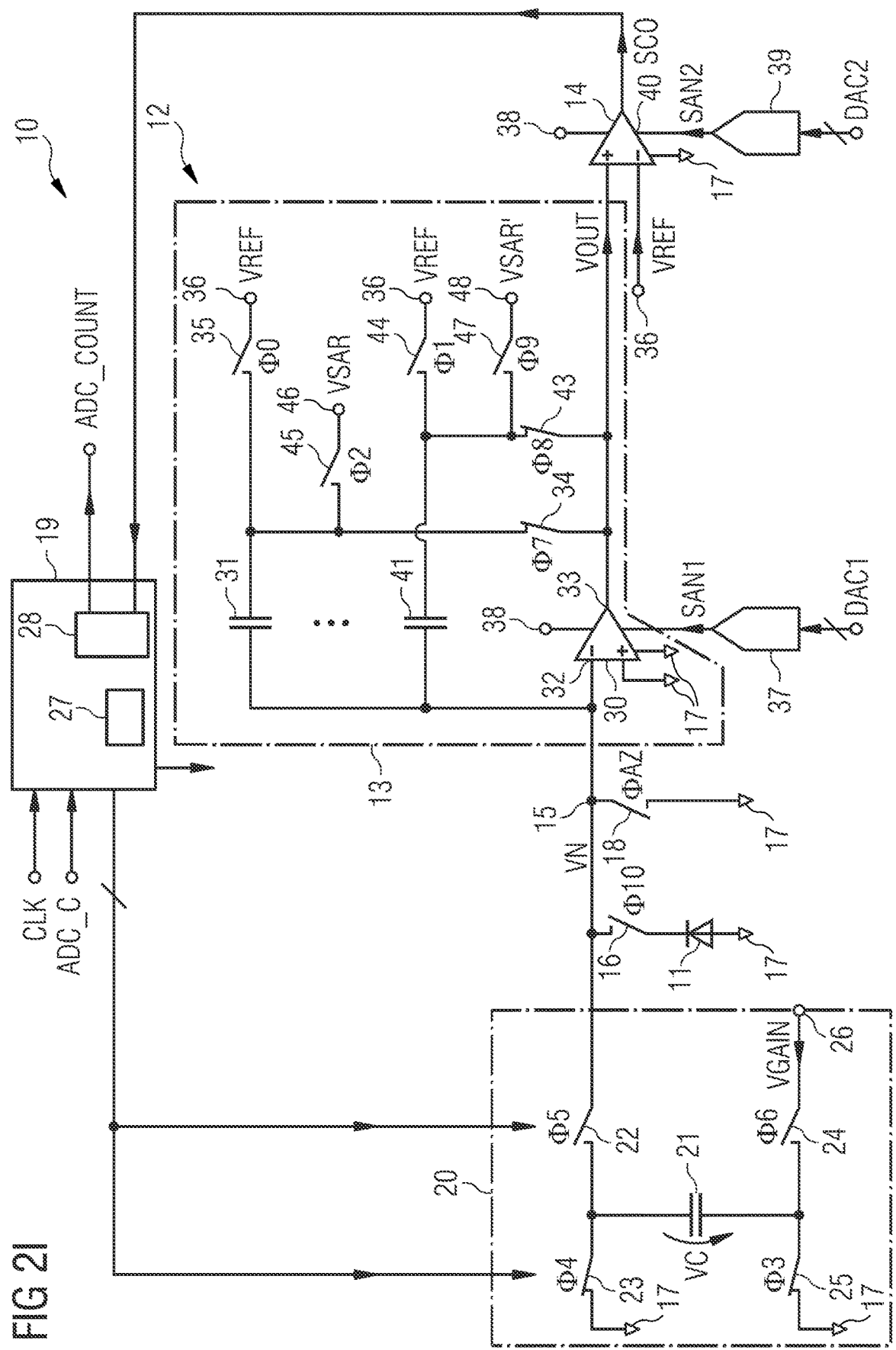
Figure 2K:
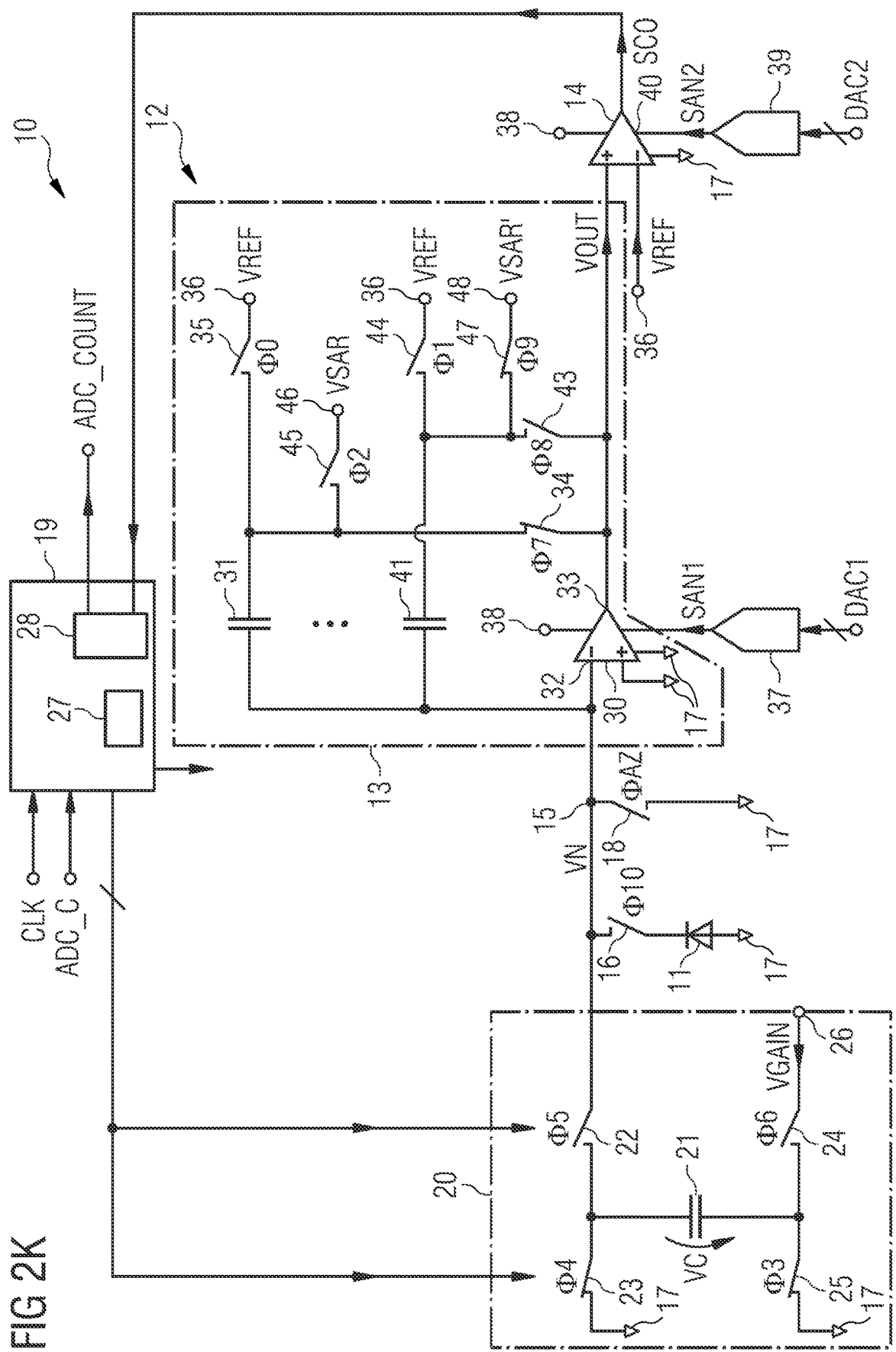

The different phases used in the optical sensor arrangement 10 are explained by FIGS. 2B to 2L. FIGS. 2B to 2F show the calibration phase A, whereas FIGS. 2G to 2J show the measuring phase B. FIGS. 2K and 2L show a residual digitization phase D following the measuring phase B.

FIG. 2B shows an embodiment of a state of the optical sensor arrangement 10 described above in a first part A1 of the calibration phase A. The control logic 19 sets the input switch 16 in a non-conducting state and the further input switch 18 in a conducting state. The first and the second switch 34, 43 are set in a non-conducting state. The first reference and the second reference switch 35, 44 are set in a conducting state. The further first and the further second switch 45, 46 are set in a non-conducting state. Thus, the reference voltage VREF is provided to the second electrode of the first and the second integrating capacitors 31, 41. A reference potential AVSS is provided to the integrator input 15. Since the input switch 16 is set in a non-conducting state, the photodiode 11 does not provide the sensor current IP to the integrator input 15.

The first and the third reference capacitor switch 22, 24 are set in a non-conducting state, whereas the second and the fourth reference capacitor switch 23, 25 are set in a conducting state. Thus, the reference capacitor 21 is discharged and decoupled from the integrator input 15.

In the first part A1 of the calibration phase A, the digital signal DAC1 provided to the calibration DA converter 37 is determined. The digital signal DAC1 is varied until the comparator output signal SCO changes its logical value. The comparator 14 toggles at this value of the digital signal DAC1. Thus, an offset of the amplifier 30 is compensated. The value of the digital signal DAC1 is stored in the memory 27 of the control logic 19. The value of the digital signal DAC1 is kept constant during a second phase A2 of the calibration phase and during the measuring phase B.

In the following, the features will be explained within a 7-step circuit operation process. The first step of circuit operation is the amplifier's input offset calibration. The circuit configuration is shown in FIG. 2B: the amplifier 30 is in open loop; its inputs are shorted to ground; amplifier's input offset is calibrated by the calibration DA converter 37 and the control logic 19; the photodiode 11 is disconnected such that the input offset calibration is light-independent; integrating capacitors 31, 41 are pre-charged into the reference voltage VREF.

FIGS. 2C and 2D show an embodiment of a state of the optical sensor arrangement 10 shown above in the second part A2 of the calibration phase A. The further input switch 18 and the first and the second reference switch 35, 44 are set in a non-conducting state. The first and the second switch 34, 43 are still in a conducting state.

Thus, the output voltage VOUT of the amplifier 30 is set close to the reference voltage VREF, since the opening of the three switches has only a small influence on the charge stored in the first and second integrating capacitor 31, 41 and thus on the output voltage VOUT. In the second part A2 of the calibration phase A, the digital input signal DAC2 that is provided to the DA converter 39 is varied. The digital input signal DAC2 is varied until the comparator output signal SCO changes its value. Thus, at the determined value of the digital input signal DAC2, the comparator 14 toggles. The determined value of the digital input signal DAC2 is stored in the memory 27 of the control logic 19. The input switch 16 is set in a non-conducting state in the first and the second part A1, A2 of the calibration phase A. Thus, a light falling on the photodiode 11 does not have any influence on the digital signal DAC1 and the digital input signal DAC2.

The reference capacitor 21 is discharged. A reference capacitor voltage VC that can be tapped between the first and the second electrode of the reference capacitor 21 is zero.

In FIG. 2D, the output voltage VOUT as a function of the time t is illustrated. The step in the output voltage VOUT is caused by the opening of the three switches.

The second step of circuit operation is shown in FIGS. 2C and 2D, where the amplifier's output offset is initialized by opening up the further input switch 18 and the first and the second reference switch 35, 44 by the control signals φAZ, φ0, φ1 and closing the first and the second switch 34, 43 by the control signals φ7, φ8. After this process, the output voltage VOUT is set close to the reference voltage VREF with some offset which will be trimmed in the next step.

The third step of circuit operation is the combined calibration for amplifier's output offset and the comparator's input offset which is shown in FIG. 2C: the amplifier 30 is in close loop; its input is on virtual ground; the output voltage VOUT is pre-set at the reference voltage VREF from the previous step; both amplifier's output offset and the comparator's input offset are calibrated by the DA converter 39 and the control logic 19; the photodiode 11 is disconnected such that the offset calibration is light-independent.

The circuit operation process of the circuit configuration in FIG. 2C can be explained in FIG. 2D. After the amplifier 30 is switched into close loop, due to charge injection from the further input switch 18 controlled by the control signal φAZ and so on, finite amplifier's output offset (marked with BL in FIG. 2D) might be different from the comparator's input offset (marked with RE); after first several steps of the calibration of the DA converter 39 (through successive approximation registering process, for example), the comparator's input offset is closer to the amplifier's offset, but still not equal; after more steps of calibration of the DA converter 39, the comparator's input offset is equal to the amplifier's offset (marked with GR) and the comparator output signal SCO goggles back and forth after that.

FIGS. 2E and 2F show an embodiment of a state of the optical sensor arrangement 10 as described above and the output voltage VOUT at the start of the measuring phase B. In the measuring phase B, the first and the second switch 34, 43 are set in a conducting state. The first and the second reference switch 35, 44 are set in a non-conducting state. The further first and the further second switch 45, 47 are also set in a non-conducting state. The further input switch 18 is set in a non-conducting state. The input switch 16 is set in a conducting state. The reference capacitor 21 is discharged. The voltage VC that can be tapped at the reference capacitor 21 is zero.

At the start of the measuring phase B, the first and the third reference capacitor switch 22, 24 are set in a conducting state. Since the voltage VGAIN is different from zero, the closing of the first and the third reference capacitor switch 22, 24 provides a charge packet CP to the integrator input 15. The charge packet CP is provided by the reference capacitor 21 to the input of the amplifier 30. This charge packet CP results in a reduction of the output voltage VOUT.

The step of the reduction of the output voltage VOUT has a predetermined value. The value of the step of the output voltage VOUT depends on the capacitance value of the reference capacitor 21, of the value of the terminal voltage VGAIN, and the capacitance values of the first and the second integrating capacitor 31, 41.

The fourth step of circuit operation is to remove one-count charge packet CP=CREF·VGAIN from the integration node that is the integrator input 15 as shown in FIGS. 2E and 2F: the second and the fourth reference capacitor switches 23, 25 controlled by the control signals φ3, φ4 are open, the first and the third reference capacitor switches 22, 24 and the input switch 16 controlled by the control signals φ5, φ6, φ10 are closed. A switch is open, when the switch is set in a non-conducting state. A switch is closed, when the switch is set in a conducting state. The charge injection from the reference switches 22 to 25 in this one-count removal initialization will be the same as the later first count generation, therefore the first count accuracy will be maintained.

FIGS. 2G and 2H show an embodiment of a state of the optical sensor arrangement 10 described above and the corresponding output signal VOUT in the measuring phase B. Since the input switch 16 is in a conducting state, the photodiode 11 provides the sensor current IP to the comparator input 15 and thus to the amplifier input 32 causing a rise of the output voltage VOUT. Every time the output voltage VOUT rises up to the switching point of the comparator 14, the comparator output signal SCO provides a pulse to the control logic 19 which in turn closes the first and the third reference capacitor switch 22, 24 (as shown in FIG. 2E). Normally, the first and the third reference capacitor switch 22, 24 are set in a non-conducting state and the second and the fourth reference capacitor switch 23, 25 are set in a conducting state as shown in FIG. 2G. At the end of the measuring phase B the output voltage VOUT has the residual output value VOUTR.

The fifth step of circuit operation is an integration period as shown in FIG. 2G: the reference capacitor switches 23, 25 controlled by the control signals φ3, φ4 are closed, the reference capacitor switches 22, 24 controlled by the control signals φ5, φ6 are open. The sensor current IP is integrated on the integrating capacitors 31, 41. If the output voltage VOUT is larger than the reference voltage VREF (more exactly larger than the switching point of the comparator 14), then an ALS count will be generated, the result signal ADC_COUNT will be incremented and one-count charge packet CP=CREF·VGAIN will be removed as shown in FIG. 2G (later ALS count generation is the same as initial set-up, therefore the first count generation is accurate). The output voltage VOUT during this process is shown in FIG. 2H, where the result signal ADC_COUNT=3 and the output voltage VOUT has a left-over residual output value VOUTR. As shown in FIG. 2H, the amplifier's output offset is the same as the calibrated comparator's input offset.

FIGS. 2I and 2J show an embodiment of the optical sensor arrangement 10 and of the output voltage VOUT in a sample and hold phase C following the measuring phase B. During the sample and hold phase C, the input switch 16 is set in a non-conducting state. Thus, the photodiode 11 does not provide the sensor current IP to the input of the amplifier 30. The output voltage VOUT is kept constant.

The 6th step is the residue sample and hold phase C which is shown in FIG. 2I. In the residue sample and hold phase C, the input switch 16 controlled by the control signal φ10 is opened. The residual output value VOUTR of the output voltage VOUT is sampled as shown in FIG. 2J.

FIGS. 2K and 2L show an embodiment of a state of the optical sensor arrangement 10 and of the output voltage VOUT in a residual digitization phase D that follows the sample and hold phase C. During the residual digitizing phase D, the input switch 16 is set in a non-conducting state. Also the first reference capacitor switch 22 is set in a non-conducting state. Additionally, the first and the second reference switch 35, 44 are set in a non-conducting state. Thus, neither the photodiode 11 nor a charge stored in the reference capacitor 21 or the reference voltage VREF have any influence on the output voltage VOUT. By appropriate setting the first and the second switch 34, 43 and the further first and the further second switch 45, 47 in a non-conducting state or a conducting state, the output voltage VOUT is amended and the value of the comparator output voltage SCO is determined. Thus, the values of the bits representing the residual output value VOUTR are determined.

If the integrator 13 comprises exactly two integrating capacitors, namely the first and the second integrating capacitor 31, 41, one bit representing the residual output value VOUTR can be determined. In the case that the integrator 13 comprises exactly four integrating capacitors, two bits representing the residual output value VOUTR can be determined. In the case the integrator 13 comprises eight integrating capacitors, the residual output value VOUTR can be digitized, resulting in three bits. Optionally, the capacitance values of the integrating capacitors 31, 41 are equal.

The 7th step is the digitization of the residual output value VOUTR which is shown in FIG. 2K. In the example shown in FIG. 2K, the integrator 13 comprises eight integrating capacitors 31, 41 (only two integrating capacitors are shown in FIG. 2K, six integrating capacitors are indicated by dots). Thus, the overall integrating capacitor is sub-divided into 8 sub-units for additional 3-bit sub-count residue digitization; for n-bit sub-count digitization, the integrator 13 comprises $2^n$ integrating capacitors 31, 41. The capacitance values of the $2^n$ integrating capacitors 31, 41 are equal.

The residue digitization is realized by a regroup procedure of the integrating capacitors 31, 41 following a successive approximation register process, abbreviated SAR process. Here the amplifier 30 is in closed loop and the residue charge is held firmly in the amplifier's virtual ground. As the comparator offset is already nullified in reference to the reference voltage VREF, by regrouping part of the integrating capacitors 31, 41 between VN and a digitizing reference voltage VSAR, the charge in these newly re-grouped integrating capacitors 31, 41 will be forced to flow into the rest of the integrating capacitors 31, 41 (between VN and VOUT or between the amplifier input 32 and the amplifier output 33), therefore a sub-count digitization can be achieved in a SAR process. The output voltage VOUT and a 3-bit sub-count digitization process is shown in FIG. 2L. The amplifier output swing may have 32 mVpp for each LSB. For additional 3-bit sub-LSB digitization, e.g. a 4 mV comparator resolution may be required and this may be achieved from comparator input offset calibration and proper design.

Thus, the result signal ADC_COUNT is a function of the pulses of the comparator output signal SCO during the measurement time TINT and of the bits determined by digitization of the residual output value VOUTR.

A comparator's input offset is calibrated to include the initial amplifier's output offset. The first ALS count is accurate as the comparator's input offset is calibrated to include the amplifier's output offset. A residue sub-count digitization scheme is followed after integration and coarse ALS count. Thus, higher digitization resolution is achieved after residue sub-count digitization.

Figure 2M:
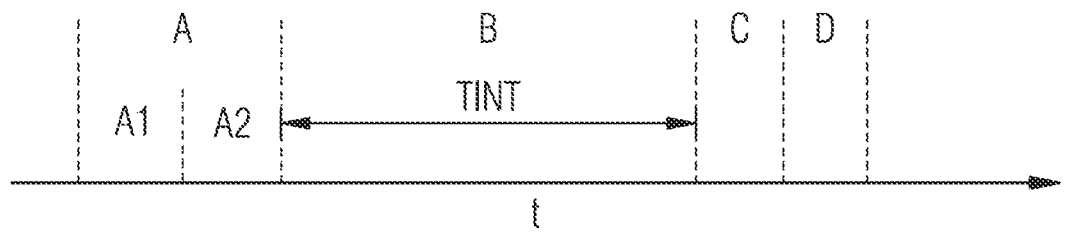

FIG. 2M shows an embodiment of the phases of the optical sensor arrangement 10 shown above. The measuring phase B follows the calibration phase A. The calibration phase A comprises a first and a second part A1, A2. The residual digitization phase D follows the measuring phase B. The sample and hold phase C is arranged between the measuring phase B and the residual digitization phase D. The sample and hold phase C may be very short or may be omitted.

In an alternative embodiment, not shown, the first part A1 of the calibration phase A is omitted. The calibration is only performed by determining an appropriate value of the digital input signal DAC2.

Figure 3:
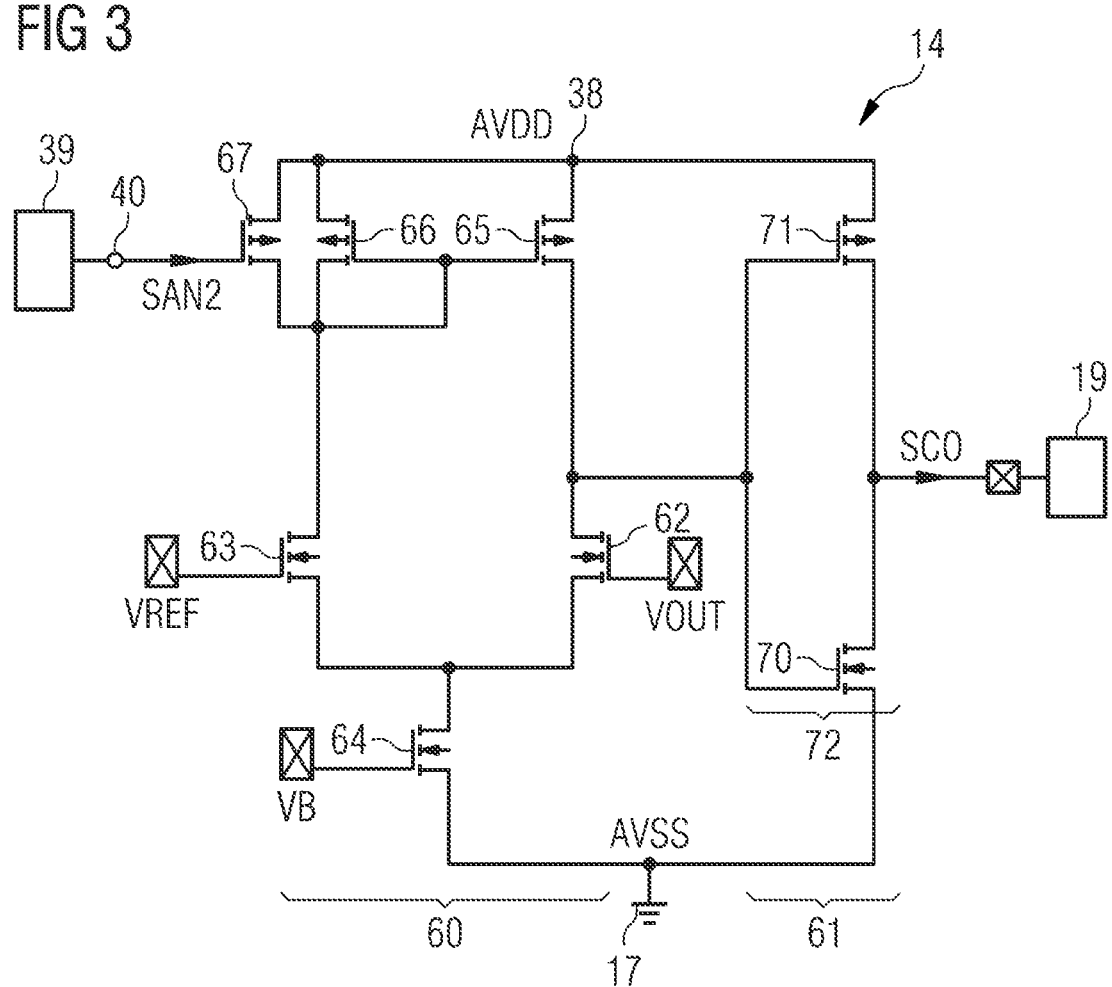
FIG. 3 shows an embodiment of a comparator.

FIG. 3 shows an embodiment of the comparator 14. This embodiment of the comparator 14 can be used in the above-shown figures. The comparator 14 has an input stage 60 and an output stage 61. The first and the second input of the comparator 14 are coupled via the input stage 60 and the output stage 61 to the comparator output of the comparator 14. The input stage 60 comprises a first and a second input transistor 62, 63. The first input of the comparator 14 is connected to a control terminal of the first input transistor 62, whereas the second input of the comparator 14 is connected to a control terminal of the second input transistor 63. A first terminal of the first input transistor 62 and a first terminal of the second input transistor 63 are coupled via a source transistor 64 of the input stage 60 to the reference potential terminal 17.

Moreover, the input stage 60 comprises a third and a fourth input transistor 65, 66. The third input transistor 65 couples the first input transistor 62 to the supply voltage terminal 38. The fourth input transistor 66 couples the second input transistor 63 to the supply voltage terminal 38. The third and the fourth input transistor 65, 66 form a current mirror. A control terminal of the third input transistor 65 is connected to a control terminal of the fourth input transistor 66. A node between the second and the fourth input transistor 63, 66 is connected to the control terminals of the third and the fourth input transistors 65, 66.

The input stage 60 comprises an input control transistor 67. The input control transistor 67 couples the second input transistor 63 to the supply voltage terminal 38. A first terminal of the input control transistor 67 is connected to the second input transistor 63. A second terminal of the input control transistor 67 is connected to the supply voltage terminal 38. Thus, the input control transistor 67 is connected parallel to the fourth input transistor 66. The output of the DA converter 39 is connected via the control terminal 40 to a control terminal of the input control transistor 67.

A node between the first and the third input transistors 62, 65 forms an output of the input stage 60 and is connected to an input of the output stage 61. The output stage 61 comprises a first and a second output transistor 70, 71 that are connected in series between the supply voltage terminal 38 and the reference potential terminal 17. A control terminal of the first output transistor 70 is connected to a control terminal of the second output transistor 71 and to the input of the output stage 61. Thus, the control terminals of the first and the second output transistors 70, 71 are coupled to the node between the first and the third input transistors 62, 65. A node between the first and the second output transistors 70, 71 is connected to the comparator output.

The transistors 62 to 67, 70, 71 of the comparator 14 are realized as field-effect transistors. The transistors 62 to 67, 70, 71 are implemented as metal-oxide-semiconductor field-effect transistors, abbreviated as MOSFETs. The first and the second input transistors 62, 63, the source transistor 64 and the first output transistor 70 are realized as n-channel MOSFETs. The third and the fourth input transistors 65, 66, the input control transistor 67 and the second output transistor 71 are implemented as p-channel MOSFETs. Thus, the first and the second output transistors 70, 71 form an inverter 72. Therefore, the input stage 60 is coupled via the inverter 72 of the output stage 61 to the comparator output.

The output voltage VOUT is provided to the control terminal of the first input transistor 62. The reference voltage VREF is provided to the control terminal of the second input transistor 63. A bias voltage VB is applied to a control terminal of the source transistor 64. The analog input signal SAN2 generated by the DA converter 39 is applied to the control terminal of the input control transistor 67. The analog input signal SAN2 controls a gate voltage of the input control transistor 67. At the reference potential terminal 17 the reference potential AVSS is tapped. The supply voltage AVDD is provided to the supply terminal 38. The comparator output signal SCO can be tapped at the output of the inverter 72 and thus at the output of the output stage 61 and is provided to the comparator output. The comparator output signal SCO depends on the values of the output voltage VOUT and of the reference voltage VREF and of the analog input signal SAN2 provided by the DA converter 39. The DA converter 39 influences the switching point of the comparator 14. The analog input signal SAN2 may have the form of a voltage. The offset of the comparator 14 depends on the analog input signal SAN2. The offset of the comparator 14 that depends on the analog input signal SAN2 may be an input offset voltage. The comparator 14 may change the comparator output signal SCO when the output voltage VOUT rises above the sum of the reference voltage VREF and the offset of the comparator 14. The comparator 14 may also change the comparator output signal SCO when the output voltage VOUT decreases below the sum of the reference voltage VREF and the offset of the comparator 14. The influence of hysteresis of the comparator 14 is neglected in this considerations, but may be added.

In an embodiment, not shown the amplifier 30 also comprises an input stage to which the analog signal SAN1 or the analog input signal SAN2 is provided. The offset of the amplifier 30 depends on the analog signal SAN1 or on the analog input signal SAN2.

In FIG. 3, a simplified circuit diagram of the comparator 14 is shown where the comparator's input offset can be controlled by the DA converter 39 by programming the gate voltage of the control input transistor 67. The input transistors 62 to 67 are part of the input stage 60 of the comparator 14. The current flowing through the control input transistor 67 will be reflected back at the two inputs of the comparator 14 as its programmed input offset.

In an alternative embodiment, not shown, the input control transistor 67 couples the first input transistor 62 to the supply voltage terminal 38. Thus, the input control transistor 67 is connected parallel to the third input transistor 65.

The invention claimed is:

1. An optical sensor arrangement, comprising
a photodiode and
an analog-to-digital converter comprising
an integrator having an integrator input coupled to the photodiode,
a comparator having a first input and a second input, wherein the first input is coupled to an output of the integrator, and wherein the second input is coupled to a reference voltage terminal, and
a digital-to-analog converter coupled to a control terminal of the comparator, wherein the digital-to-analog converter provides an analog input signal to the control terminal of the comparator, and an offset of the comparator is controlled by the analog input signal.

2. The optical sensor arrangement according to claim 1, comprising an input switch that couples the photodiode to the integrator input.

3. The optical sensor arrangement according to claim 1, comprising a further input switch that couples the integrator input to a reference potential terminal.

4. The optical sensor arrangement according to claim 1, wherein the analog-to-digital converter comprises a reference capacitor circuit that is coupled to the integrator input and is configured to provide at least a charge packet to the integrator input.

5. The optical sensor arrangement according to claim 1, comprising a control logic coupled to a comparator output of the comparator.

6. The optical sensor arrangement according to claim 1, wherein the integrator comprises an amplifier having a first amplifier input connected to the integrator input and an amplifier output coupled to the output of the integrator and
the integrator comprises a first integrating capacitor with a first electrode coupled to the first amplifier input and with a second electrode coupled to the amplifier output.

7. The optical sensor arrangement according to claim 6, wherein the analog-to-digital converter comprises a calibration digital-to-analog converter coupled to a control terminal of the amplifier.

8. The optical sensor arrangement according to claim 6, wherein the integrator comprises
a first switch coupling the second electrode of the first integrating capacitor to the amplifier output and
a first reference switch coupling the second electrode of the first integrating capacitor to a reference voltage terminal.

9. The optical sensor arrangement according to claim 8, wherein the integrator comprises
a second integrating capacitor with a first electrode coupled to the first amplifier input,
a second switch coupling a second electrode of the second integrating capacitor to the amplifier output and
a second reference switch coupling the second electrode of the second integrating capacitor to the reference voltage terminal.

10. The optical sensor arrangement according to claim 9, wherein the integrator comprises
a further first switch coupling the second electrode of the first integrating capacitor to a further reference voltage terminal and
a further second switch coupling the second electrode of the second integrating capacitor to an additional reference voltage terminal.

11. A method for light sensing, comprising
providing an analog input signal by a digital-to-analog converter to a control terminal of a comparator, wherein an offset of the comparator is controlled by the analog input signal,
generating a sensor current by a photodiode and providing the sensor current to an integrator input of an integrator, generating an output voltage by the integrator and providing the output voltage to a first input of the comparator, wherein a second input of the comparator is coupled to a reference voltage terminal, and determining a digital value of the sensor current as a function of a comparator output signal generated by the comparator.

12. The method according to claim 11,
wherein a value of the analog input signal is determined in a calibration phase and is kept constant during a measuring phase following the calibration phase.

13. The method according to claim 11,
wherein a second input of the comparator is coupled to a reference voltage terminal, and
wherein an offset of the comparator is controlled by the analog input signal.

14. The method according to claim 13,
wherein the comparator output signal depends on the values of the output voltage, of a reference voltage tapped at the reference voltage terminal and of the analog input signal.

15. An optical sensor arrangement, comprising:
a photodiode and
an analog-to-digital converter comprising
an integrator having an integrator input coupled to the photodiode,
a comparator having a first input coupled to an output of the integrator, and
a calibration digital-to-analog converter,
wherein the integrator comprises an amplifier having a first amplifier input connected to the integrator input, a second amplifier input, a control terminal and an amplifier output coupled to the output of the integrator,
wherein the calibration digital-to-analog converter is coupled to the control terminal of the amplifier, generates an analog signal and applies the analog signal to the control terminal of the amplifier, and
wherein the offset of the amplifier depends on the analog signal.

* * * * *